US007894614B2

(12) United States Patent
Cordell

(10) Patent No.: US 7,894,614 B2

(45) Date of Patent: Feb. 22, 2011

(54) SYSTEM AND METHOD FOR ACHIEVING EXTENDED LOW-FREQUENCY RESPONSE IN A LOUDSPEAKER SYSTEM

(75) Inventor: Robert Roger Cordell, Holmdel, NJ (US)

(73) Assignee: Robert R. Cordell, Holmdel, NJ (US)

( * ) Notice: Subject to any disclaimer, the term of this patent is extended or adjusted under 35 U.S.C. 154(b) by 1832 days.

(21) Appl. No.: 10/965,981

(22) Filed: Oct. 15, 2004

(65) Prior Publication Data

US 2005/0094829 A1 May 5, 2005

Related U.S. Application Data

(60) Provisional application No. 60/516,803, filed on Nov. 3, 2003.

(51) Int. Cl.
*H03G 5/00* (2006.01)
*H04R 1/20* (2006.01)
*H04R 25/00* (2006.01)

(52) U.S. Cl. ....................... 381/103; 381/337; 381/338; 381/345; 381/349; 381/106; 381/98; 381/186; 381/182

(58) Field of Classification Search ................. 381/103, 381/338, 337, 345, 349, 98, 99, 182, 186, 381/56–59, 106; 181/155, 156
See application file for complete search history.

(56) References Cited

U.S. PATENT DOCUMENTS

| | | | | |
|---|---|---|---|---|
| 3,715,501 | A * | 2/1973 | Russell | 381/335 |
| 4,154,979 | A * | 5/1979 | Barker | 381/335 |
| 4,481,662 | A * | 11/1984 | Long et al. | 381/98 |
| 6,566,960 | B1 * | 5/2003 | Carver | 330/297 |
| 2002/0061114 | A1 * | 5/2002 | Croft, III | 381/345 |

* cited by examiner

*Primary Examiner*—Devona E Faulk

(57) ABSTRACT

A system and method for achieving extended low-frequency response and increased low-frequency sound pressure output capability in a loudspeaker system is provided. The system and method comprise mounting a low-frequency driver in a ported box, tuning the ported box to a sufficiently low frequency so as to result in a frequency response that can be modeled substantially as a second-order response, and equalizing the response of said driver-box combination with a second-order biquadratic filter function to achieve the desired frequency response characteristic.

15 Claims, 9 Drawing Sheets

SYSTEM AND METHOD FOR ACHIEVING EXTENDED LOW-FREQUENCY RESPONSE IN A LOUDSPEAKER SYSTEM

CROSS REFERENCE TO RELATED APPLICATION

This application is based on and claims the benefit of U.S. Provisional Application Ser. No. 60/516,803, entitled SYSTEM AND METHOD FOR ACHIEVING EXTENDED LOW-FREQUENCY RESPONSE IN A LOUDSPEAKER SYSTEM, filed Nov. 3, 2003, the entire disclosure of which is incorporated by reference herein.

BACKGROUND OF THE INVENTION

The present invention relates to a system and method for achieving extended low frequency response and output sound pressure level capability at low frequencies.

In loudspeaker systems, especially high quality audio systems that are intended to produce the full range of audible signals, particularly those at low frequencies, a major design challenge lies in achieving adequate low-frequency extension, both in terms of low frequency response and maximum achievable sound pressure levels (SPL) at low frequencies. This challenge is further increased when this performance must be achieved in a small enclosure, or with small loudspeaker drivers, or both.

One of the major challenges in loudspeaker system design, in terms of low-frequency performance, is to achieve a frequency response that extends to low frequencies in or below the 30-50 Hz range. A more difficult challenge is to achieve high output sound pressure levels (SPL) at these same low frequencies, owing to the need to move large amounts of air in order to achieve high sound pressure levels. Because the maximum cone excursion of the driver determines the amount of air that can be moved (in combination with the driver's effective cone area), this limitation is referred to as Excursion-Limited SPL, or ELSPL. The ELSPL of a driver is a function of frequency, and typically decreases at lower frequencies because at low frequencies a correspondingly larger amount of air must be moved to achieve a given SPL.

Most conventional loudspeaker system designs representative of the prior art fall into one of two broad categories. Sealed systems, often called closed-box systems, or acoustic suspension systems, provide a second-order high-pass frequency response. They suffer from higher low-frequency −3 dB cutoff frequencies (f3) and low ELSPL. The low frequency cutoff frequency of a sealed system can be reduced, but at the expense of a much larger box. Alternatively, the f3 of such a system may be reduced by employing a heavier cone, which reduces the resonant frequency of the system. Use of this latter technique usually results in much reduced electro-acoustic efficiency. In either case, however, low-frequency ELSPL is not increased.

Ported systems, also known as vented systems or bass reflex systems, add a port to the box in which the driver is mounted, forming a Helmholtz resonator. When properly designed, the box-port Helmholtz resonance produces a lower f3 and also produces a higher ELSPL at low frequencies. In such systems, the box-port Helmholtz resonant frequency is referred to as fb. These systems provide a fourth-order high pass frequency response. As frequency is reduced from higher frequencies down to f3 and then to frequencies below f3, the frequency response begins to fall off very sharply, at a rate approaching 24 dB/octave. The steep rolloff typically begins at frequencies below the box tuning frequency fb. The steep low frequency rolloff tends to cause group delay distortion and poor transient response. Although ported systems provide increased ELSPL at frequencies above f3, the ELSPL of ported systems falls off severely at frequencies below fb, providing virtually no useful output at such frequencies. Ported systems actually produce LESS ELSPL than that of a comparable sealed system at frequencies below fb of the ported system.

One commercial example of a low-frequency sealed system designed for extended low-frequency performance is a subwoofer implemented by Carver Corp. (U.S. Pat. No. 6,566,960). It is essentially a brute-force sealed system that employs a special driver with very large cone mass and very large cone excursion. The design results in very low efficiency and requires extremely high drive power. The very high cone mass also compromises transient response.

A small number of sealed systems employ equalization in order to achieve an extended low frequency response with a reduced f3. This approach does not suffer from the approaches mentioned above wherein larger cabinets or reduced electrical efficiency is required. Such equalization is most often done with an active filter placed in the signal path prior to the power amplifier that drives the loudspeaker. These equalizers typically provide a biquadratic filter function that includes a pair of zeros and a pair of poles. The pair of zeros is typically placed at or near the same frequency as the pair of poles produced by the unequalized sealed system. The pair of biquadratic poles is placed at a lower frequency corresponding to the desired equalized f3 of the system. Such an equalizer is also well known to those familiar with the prior art as a Linkwitz Transform.

This technique, referred to here as an Equalized Sealed System (ESS), is very effective at improving the frequency response of the sealed system loudspeaker. However, it also does nothing to improve or increase the low-frequency ELSPL. Therefore, in order to be practical, and to have an ELSPL commensurate with the extended low frequency response afforded by the ESS technique, such systems typically must employ a large driver with a very large excursion capability. Such systems may typically employ equalization to move the system f3 down by about one octave. This corresponds roughly to 12 dB of equalization, which in turn corresponds to an increased power of 16 times at the f3 of the equalized system. This is a direct consequence of the greatly reduced efficiency of a sealed system at frequencies below its unequalized f3. As a result, large power amplifiers are often required for use with such systems.

The Bag End ELF system (U.S. Pat. No. 4,481,662) is a commercial example of an equalized sealed system. This system comprises essentially a double integrator equalizer placed in the input signal path of a sealed system. This is an alternative to the above-mentioned Linkwitz Transform, and has all of the same shortcomings. In particular, this approach does nothing to improve ELSPL. Yet another equalized sealed system is described in Russell U.S. Pat. No. 3,715,501.

Ported systems can in principle be equalized, but in practice they virtually never are equalized. This is partly due to the greater difficulty of accurately equalizing a fourth-order system. More importantly, however, is the fact that it makes little sense to equalize a conventional ported system to achieve a lower f3, since the fb of a conventional ported system usually lies near the box tuning frequency, and the ELSPL drops off severely at frequencies below fb. For these reasons, it has heretofore usually been impractical to equalize ported systems.

One example of combining an "equalizer" with a ported system is claimed by Bose Corp. (U.S. Pat. No. 4,154,979).

This is merely a variant of the well-known $6^{th}$ order Chebeychev vented alignment originally described by Theile. This approach provides a small amount of bass extension at the expense of a much worse transient response. The active filter in this approach is essentially a second-order high-pass filter, unlike the low-pass equalizer characteristic of the present invention. This approach also does little for low-frequency SPL capability.

Known approaches and arrangements for achieving extended low-frequency performance are thus sub-optimal in one or more of the performance metrics that include f3, ELSPL, efficiency, box size and transient response. All of the above-mentioned approaches, techniques and inventions fail to realize the combined benefits of the present invention.

SUMMARY OF THE INVENTION

The present invention addresses the above limitations of known methods for providing low-frequency sound from loudspeaker systems. The present invention is directed to aspects relating to achieving extended low-frequency response and SPL capability in a loudspeaker system. It was discovered that a ported system acted much like a sealed system in regard to frequency response shape and rolloff slope over an extended band of low frequencies when the box tuning frequency was substantially lower than that commonly used with a given driver-box combination. It was further discovered that the low-frequency SPL capability of such a system was greatly improved, as compared with that of a similar sealed system, even at frequencies well below the 3 dB frequency response point of the driver-ported box combination. It is understood by those with ordinary skill in the art that the "3 dB frequency" is the frequency where the amplitude response is down 3 dB from a reference response or nominal response amplitude. It is further understood that this frequency is the frequency down to which a loudspeaker frequency response is said to be "flat". Hereinafter we refer to such a ported system that has a frequency response similar to that of a sealed system as a Quasi Sealed System (QSS). We further define a Virtual Sealed System (VSS) as a sealed system design whose box volume and driver parameters have been manipulated so that its frequency response accurately models that of a Quasi Sealed System over the frequency range of interest.

In accordance with one aspect of the present invention, there is provided a method of achieving extended low-frequency performance in a loudspeaker system. The method comprises mounting a loudspeaker driver in a ported box, tuning the ported box to an unconventionally low box tuning frequency fb, and equalizing the resulting frequency response to become a desired frequency response that extends to lower frequencies than would be the case without the step of equalization. The combination of the driver, box, port and tuning frequency comprises a QSS as described hereinabove. One example of such a QSS has a frequency response that is accurately modeled by a second-order high-pass frequency response over a frequency range of interest that includes frequencies that are at least one-half octave below the box tuning frequency. The example QSS is further characterized by a frequency response at the box tuning frequency that is at least 6 dB down from the frequency response of the QSS at frequencies well above the box tuning frequency. The example QSS is still further characterized by a frequency response that is equal to within 1 dB of the frequency response of a second order high-pass function over frequencies extending to at least one-half octave below the box tuning frequency. The example QSS has a frequency response that is much more like that of a sealed system than that of a ported system. Applicant points out that not all QSS for use in the Invention necessarily have all of these example characteristics.

In a preferred embodiment, the tuning step of this method further comprises setting the box tuning frequency such that the frequency response of the driver-box combination at the box tuning frequency is substantially below the reference response level (e.g., –6 to –12 dB). More preferably, the resulting frequency response is a good approximation to a second order high-pass frequency response down to frequencies at least one-half octave below the box tuning frequency. In this preferred embodiment the combined driver, box, port and tuning frequency comprise a Quasi Sealed System (QSS) as described hereinabove. In this preferred embodiment, the step of equalization includes providing at least one biquadratic filter function providing at least two poles and two zeros in its frequency response. Preferably, the step of equalization further includes the step of computing the equalizer parameters in accordance with proper equalization of the Virtual Sealed System whose frequency response accurately models that of the Quasi Sealed System. The equalizer is characterized by a maximum equalization gain. The equalizer alters the frequency response of the QSS in such a way as to make the resulting frequency response flat to substantially lower frequencies than those to which the QSS is flat. This embodiment of the present invention, including the step of equalization, is therefore referred to hereinafter as an Equalized Quasi Sealed System (EQSS).

In yet another aspect of the present invention, there is provided a loudspeaker apparatus, comprising a loudspeaker driver for producing sound in response to an electrical signal, a box of a given enclosed volume for housing the loudspeaker driver, a port for tuning the box to a box tuning frequency, and an equalizer for altering the frequency response of the loudspeaker apparatus so as to achieve the desired frequency response. Preferably, the box tuning frequency is set so that the driver-box-port-tuning frequency combination comprises a Quasi Sealed System (QSS) as described hereinabove. One example of such a QSS has a second-order high-pass frequency response characteristic over a frequency range extending to frequencies that are at least one-half octave below the box tuning frequency. The example QSS also has a frequency response at the box tuning frequency that is down by at least 6 dB from the reference level discussed hereinabove. More preferably, the equalizer is a biquadratic filter providing at least two poles and two zeros in its frequency response. Stilt more preferably, the frequency response shape of said equalizer is such that, if it were applied to equalize a Virtual Sealed System that accurately models the Quasi Sealed System, it would yield the desired overall system frequency response, the desired frequency response being flat to substantially lower frequencies than those frequencies to which the OSS is flat.

BRIEF DESCRIPTION OF THE DRAWINGS

For purposes of illustrating various aspects of the invention and to provide a further understanding of the method and system of the invention, together with the detailed description, the drawings show forms that are presently preferred, it being understood, however, that the invention is not limited to the precise arrangements and instrumentalities shown, wherein.

DETAILED DESCRIPTION

Figure 1:
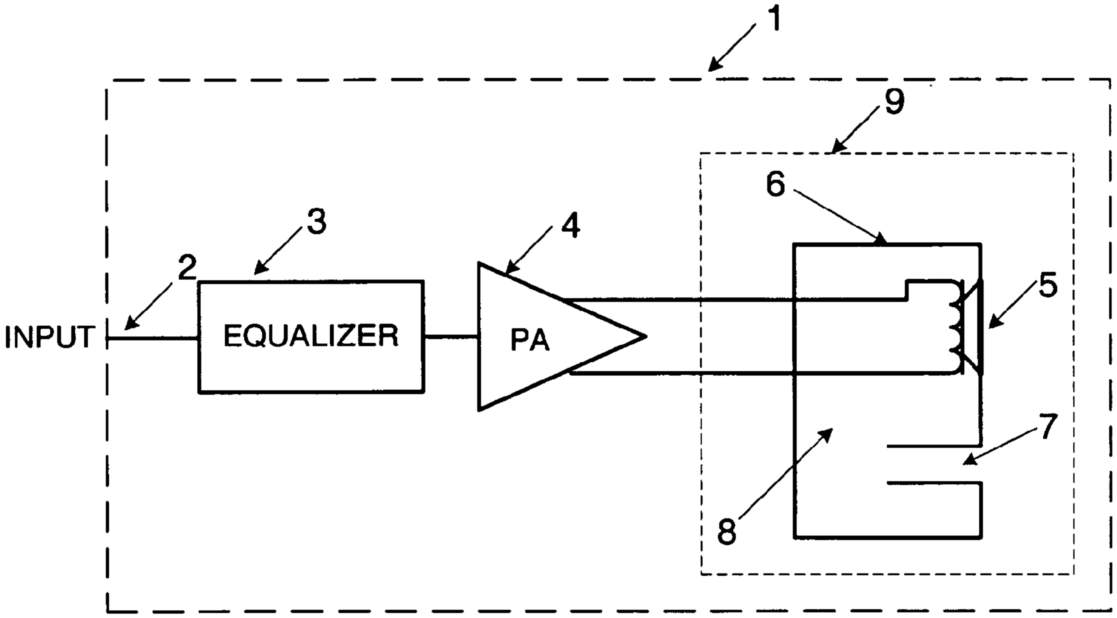
FIG. 1 is a block diagram showing an EQSS system 1 comprising an input signal 2 driving an equalizer 3, which drives an amplifier 4, which in turn drives a quasi-sealed system 9 that comprises loudspeaker driver 5 that is housed in a box 6 that includes a port 7, and a box tuning frequency 8.

Referring now to the drawings, wherein like numerals indicate like elements,

FIG. 1 depicts a block diagram 1 of a loudspeaker system employing the EQSS method and apparatus. For purposes of illustration, and without any narrowing of the intended scope of the invention, component values are provided in some cases. FIG. 1 is a block diagram showing an EQSS system 1 comprising an input signal 2 driving an equalizer 3, which drives an amplifier 4, which in turn drives a loudspeaker driver 5 that is housed in a box 6 that includes a port 7, and a box tuning frequency 8. For reasons that will become apparent hereinbelow, the driver 5, box 6, port 7 and tuning frequency 8 comprise what will be hereinafter referred to as a Quasi Sealed System (QSS) 9.

Figure 2:
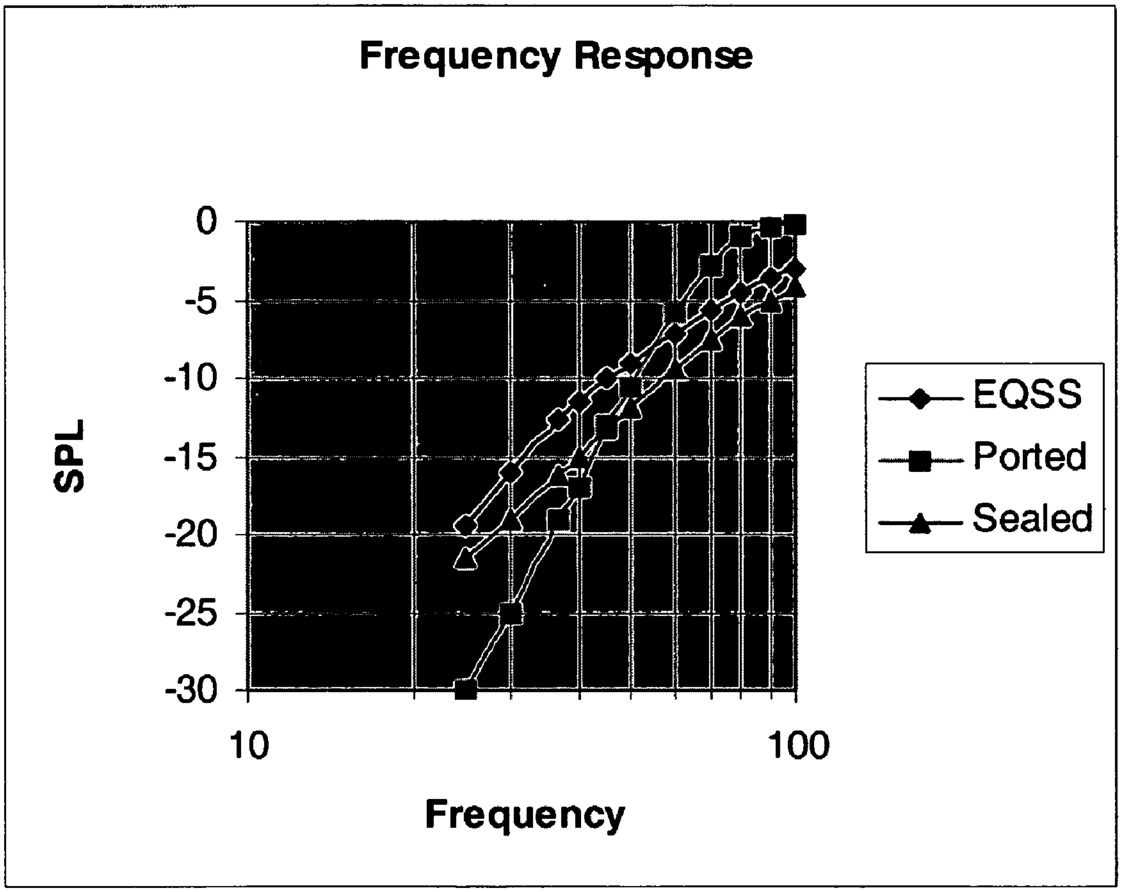
FIG. 2 is a frequency response graph showing the unequalized frequency responses of a sealed system (denoted by triangles), a conventional ported system (denoted by squares), and a Quasi Sealed System (denoted by diamonds)

FIG. 2 illustrates the frequency responses of three different speaker systems, all without equalization. The vertical axis indicates relative sound pressure level (SPL), while the horizontal axis indicates frequency in Hertz (Hz). All three systems employ the same 5.25-inch loudspeaker driver in the same box volume. The driver is characterized by Thiele-Small parameters, well known to those familiar with the art. The driver has the following Thiele-Small parameters: Vas=15.5 L; fs=55 Hz; Qts=0.35; Xmax=2.5 mm. The volume of the box is 9 Liters.

The first system, whose frequency response 21 is denoted by triangles in the graph, is a conventional sealed-box system typical of the prior art. It has a second-order frequency response rolloff with decreasing frequency at a rate of approximately 12 dB per octave. Its frequency response 21 is down 3 dB at approximately 110 Hz (not shown), relative to a reference level of 0 dB at higher frequencies. At a much lower frequency of 35 Hz, its response is down approximately 16 dB from the reference level.

The second system, whose frequency response 22 is denoted by squares, is a ported system also typical of the prior art. It includes a port that tunes the box to a box frequency fb of approximately 65 Hz. The ported system has an extended low-frequency 3 dB response as compared to the sealed system just described. Its response is down 3 dB at approximately 68 Hz. However, its response at the much lower frequency of 35 Hz is down about 19 dB, having a weaker response at this lower frequency than the sealed system. It has a fourth-order frequency response rolloff with decreasing frequency at a rate of approaching 24 dB per octave. Such a frequency response tradeoff between sealed and ported systems of the prior art is typical.

The third system, whose frequency response 23 is denoted by diamonds, is a system based on the EQSS method and apparatus of the present invention. It is a Quasi Sealed System (QSS) implemented with the same driver in the same box volume as the sealed system described hereinabove, but with a port added whose diameter and length cause the box to be tuned to a Helmholtz box frequency fb of approximately 37 Hz. The QSS arrangement has a second-order rolloff like that of the sealed system for most of the frequency range, but it has increased low-frequency response as compared to the sealed system. Its frequency response 23 is down 3 dB at 100 Hz as compared to 110 Hz for the sealed system. At the much lower frequency of 35 Hz, its frequency response is down only 13 dB, as compared to the conventional sealed system whose response is down 16 dB at the same frequency. The QSS system thus exhibits a 3 dB increase in efficiency at 35 Hz as compared with the sealed system. Although the QSS system is ported, it can been seen that its frequency response is much more like that of a sealed system than a ported system. It is for this reason that it is referred to as a Quasi Sealed System. Note also that the QSS response 23 is fully 6 dB stronger than the response 22 of the ported system at 35 Hz.

The frequency response of the QSS system is accurately modeled by a so-called Virtual Sealed System (VSS) consisting of a sealed box of volume 12 Liters and a 5.25-inch driver with the following Thiele-Small parameters: Vas=20 L; fs=43 Hz; Qts=0.33. The virtual sealed system is characterized by a critical frequency of 70 Hz, a 3 dB frequency f3 of 98 Hz, and a Q of 0.54.

Based on these observations, it should be understood by one of ordinary skill in the art that the Quasi Sealed System 9, although ported, acts like a sealed system, but with increased efficiency at low frequencies. It should also be understood that the frequency response of the QSS may be equalized in the same way as the Virtual Sealed System, using the same biquadratic filter function, since their frequency responses are essentially the same. If the response of the Quasi Sealed System is equalized to become a more desirable one, the EQSS apparatus of the present invention will be the result.

Figure 3:
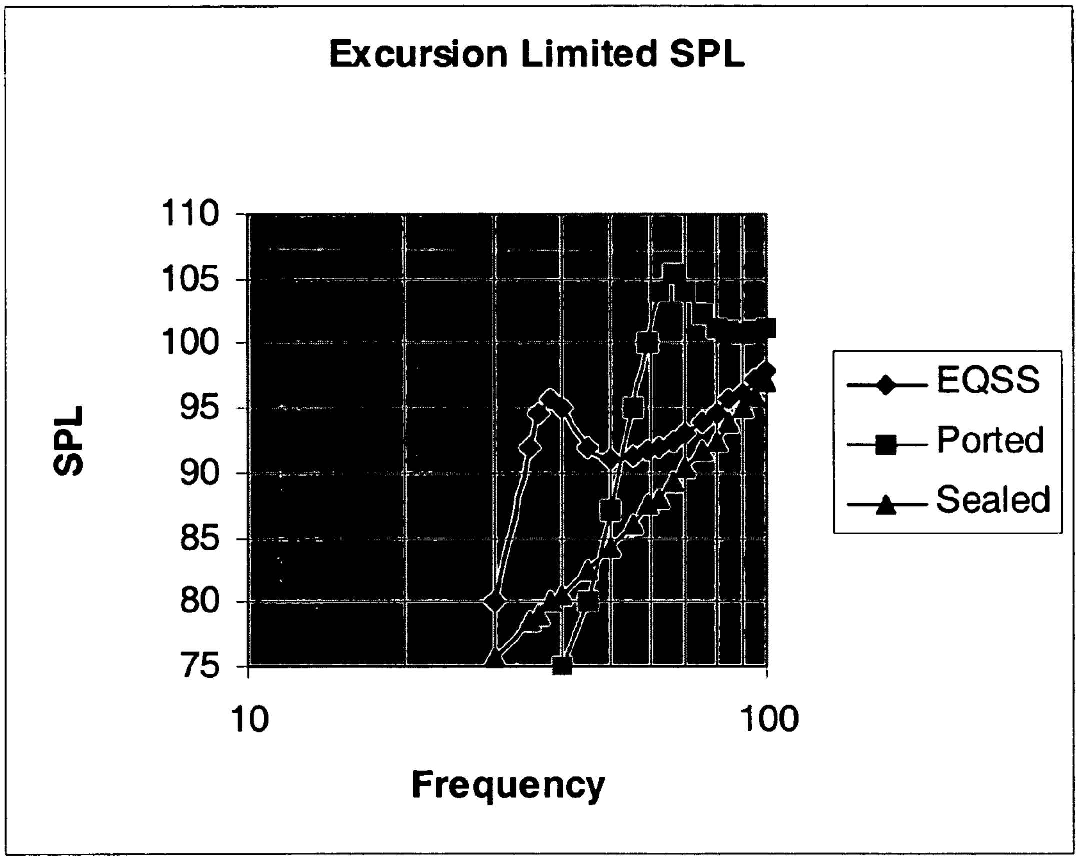
FIG. 3 is a graph showing maximum Excursion-Limited SPL (ELSPL) as a function of frequency for a sealed system (denoted by triangles), a conventional ported system (denoted by squares), and a Quasi Sealed System (denoted by diamonds)

FIG. 3 illustrates the Excursion-Limited SPL (ELSPL) of three different speaker systems all identical to those discussed hereinabove in connection with FIG. 2. The vertical axis indicates Sound Pressure Level (SPL), while the horizontal axis indicates frequency in Hertz. It is well known in the art of loudspeaker design that the maximum undistorted SPL that can be reproduced by a loudspeaker at low frequencies is limited by the distance that the loudspeaker's cone can move in and out. This distance is referred to as the loudspeaker's excursion. In order to reproduce sound at low frequencies at high levels, a loudspeaker must move a large amount of air. The loudspeaker's ability to move air is called its displacement. A loudspeaker's displacement is proportional to the product of its cone diameter and its excursion. This is why, for a loudspeaker of a given diameter, its maximum low-frequency SPL is limited by its maximum excursion. Because the amount of air that must be moved for a given SPL is a function of frequency, the ELSPL for a given loudspeaker is a function of frequency, as shown in FIG. 3. It should be noted that the SPL values in FIG. 3 are obtained at whatever electrical drive level is necessary to cause the loudspeaker driver to operate at its maximum excursion (Xmax) at the given frequency.

FIG. 3 shows the Excursion Limited SPL for three systems as a function of frequency. Those systems are the conventional sealed system, the conventional ported system, and the Quasi Sealed System that is the subject of the present invention. The first system, whose ELSPL 31 is denoted by triangles in the graph, is a conventional sealed-box system typical of the prior art, identical to the sealed system used in FIG. 2. As can be seen from FIG. 3, it is capable of an ELSPL of at least 87 dB SPL down to a frequency of 60 Hz. However, at the much lower frequency of 35 Hz, it is capable of an ELSPL of only 78 dB SPL. This greatly reduced SPL capability at low frequencies is typical of sealed systems.

The second system, whose ELSPL 32 is denoted by squares, is a ported system also typical of the prior art, and identical to the ported system used in FIG. 2. As can be seen from FIG. 3, the ported system provides substantially larger ELSPL over the mid and upper bass range than the sealed system. This is due to the action of the port, which loads the loudspeaker driver and produces substantial SPL output at frequencies in the vicinity of the box tuning frequency f3. As can be seen from FIG. 3, the ported system is capable of an ELSPL of at least 102 dB down to a frequency of 60 Hz. This is fully 15 dB of increased SPL output capability as compared to the sealed system at a frequency of 60 Hz. If system reproduction down to only 60 Hz were the objective, the ported system would be entirely satisfactory. However, one objective of the present invention is to obtain both frequency response and useful amount of output down to lower frequencies. One well understood characteristic of conventional ported systems is that their ELSPL drops precipitously at frequencies below the box tuning frequency f3. This can be seen in FIG. 3. At the very low frequency of 35 Hz, the ELSPL of the ported system is actually far worse than that of the sealed system, being only approximately 70 dB SPL at 35 Hz. Thus, the ported system is fully 8 dB less capable of ELSPL than the sealed system at 35 Hz.

Based on these observations, it should be understood by one of ordinary skill in the art that ported systems are not satisfactory for reproducing deep bass at frequencies below the box tuning frequency f3. Conventional ported systems with very low box tuning frequencies generally cannot be implemented in small boxes with small drivers.

The third system, whose ELSPL 33 is denoted by diamonds, is a QSS arrangement based on the EQSS method and apparatus of the present invention, and is identical to the one used in FIG. 2. It can be seen from FIG. 3 that the Quasi Sealed System (QSS) is capable of an ELSPL of at least 92 dB SPL down to frequencies as low as 60 Hz. This is a substantial 5 dB better than the sealed system over the same frequency range. It is less than the 102 dB ELSPL capability of the ported system, but the larger ELSPL of the ported system is not in a frequency range where it is really needed when viewed in the context of the objectives of the present invention. Herein we begin to see the engineering tradeoff made possible by the EQSS method and apparatus that is the subject of the present invention.

Referring now to the ELSPL capability at frequencies ranging down to as low as 35 Hz, it is evident that the Quasi Sealed System is capable of an ELSPL of at least 91 dB SPL over this frequency range. This is 13 dB better than the 78 dB ELSPL capability of the sealed system at 35 Hz. This is a remarkable 21 dB better than the 70 dB ELSPL capability of the ported system at the same 35 Hz frequency.

It should be noted that a typical application of the 5.25-inch EQSS woofer apparatus in the above example might include a stereo pair of loudspeaker systems, each with two such 5.25-inch woofers. It is well known by those familiar with the art that each doubling of the number of identical drivers in a speaker system results in a 6 dB increase in ELSPL for the total system. The typical application described here involves two such doublings, for a total of four 5.25-inch drivers, resulting in a 12 dB increase in system ELSPL. Returning to FIG. 3, it is evident that a single illustrative 5.25-inch driver operating in accordance with the principles of the present invention is capable of an ELSPL of at least 91 dB SPL over the frequency range extending down to 35 Hz. Therefore, the typical four-driver application cited by example here will be capable of an ELSPL of 91+12=103 dB SPL down to frequencies as low as 35 Hz. This is remarkable for a system employing such small drivers, and in many cases would provide sufficient low-frequency performance so as to reduce or eliminate the need for a subwoofer.

Further to the typical example above employing a total of four 5.25-inch drivers is the matter of system sensitivity and required amplifier power. Each 5.25-inch driver in the example arrangement has a reference efficiency of 90.3 dB SPL @ 1 Watt/1 Meter. In the EQSS arrangement, the unequalized frequency response and efficiency of the QSS are down 13 dB at 35 Hz, resulting in an operating efficiency of 77.3 dB SPL @ 1 Watt/1 Meter at a frequency of 35 Hz. It is well known by those familiar with the art that each doubling of the number of identical drivers in a speaker system results in a 3 dB increase in efficiency for the total system. The typical application described here involves two such doublings, for a total of four 5.25-inch drivers, resulting in a 6 dB increase in system efficiency as compared to that for a single driver. Therefore, the typical four-driver application cited by example here will exhibit a total system efficiency of 77.3+6=83.3 dB SPL @ 1 Watt/1 Meter at a frequency of 35 Hz. The system will therefore be capable of reaching its ELSPL of 103 dB at 35 Hz with slightly less than 100 Watts total input power, or 50 Watts per channel from a stereo amplifier.

Based on all of these observations, it should be understood by one of ordinary skill in the art that the EQSS method and apparatus of the present invention provides a very advantageous system-level tradeoff heretofore unavailable in low frequency loudspeaker design. Specifically, it permits the achievement of a higher ELSPL at low frequencies for a given combination of box size and loudspeaker driver than either a sealed system or a conventional ported system. Moreover, as is evident from FIG. 2, it achieves a higher sensitivity at the low frequencies of interest than the sealed or ported systems of the prior art. This means that less amplifier power is required to achieve a given low-frequency SPL. A still further advantage is that the EQSS method and apparatus achieves these advantages while providing a low frequency rolloff that is essentially second-order in nature. This results in reduced group delay distortion and improved transient response.

Figure 4:
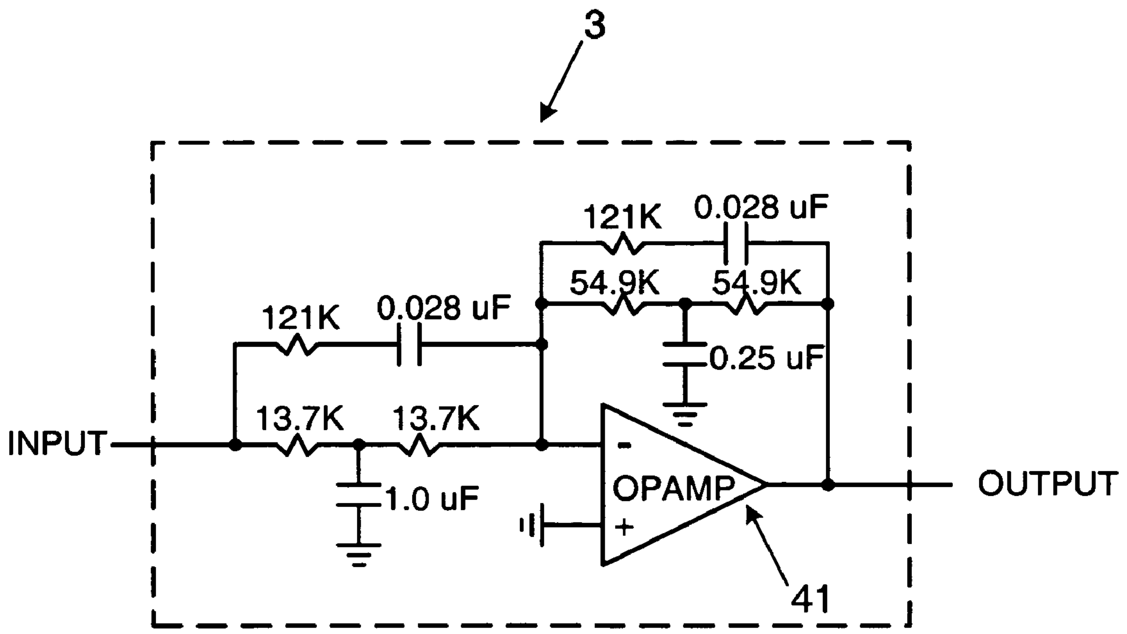
FIG. 4 depicts a schematic diagram of an equalizer circuit 3 that is suitable for use in implementing the EQSS method and apparatus of the present invention.

FIG. 4 depicts a schematic diagram of an equalizer circuit 3 that is suitable for use in implementing the EQSS method and apparatus of the present invention. In no way should the specificity of the equalizer of FIG. 4 be construed as to limit in any way the scope or applicability of the invention. Such a suitable equalizer may take many forms, and can be designed by those skilled in the art by widely available software programs. The combination of passive components and the operational amplifier 41 in FIG. 4 implements a biquadratic active filter function sometimes referred to by those familiar with loudspeaker system design as a Linkwitz Transform.

Figure 5:
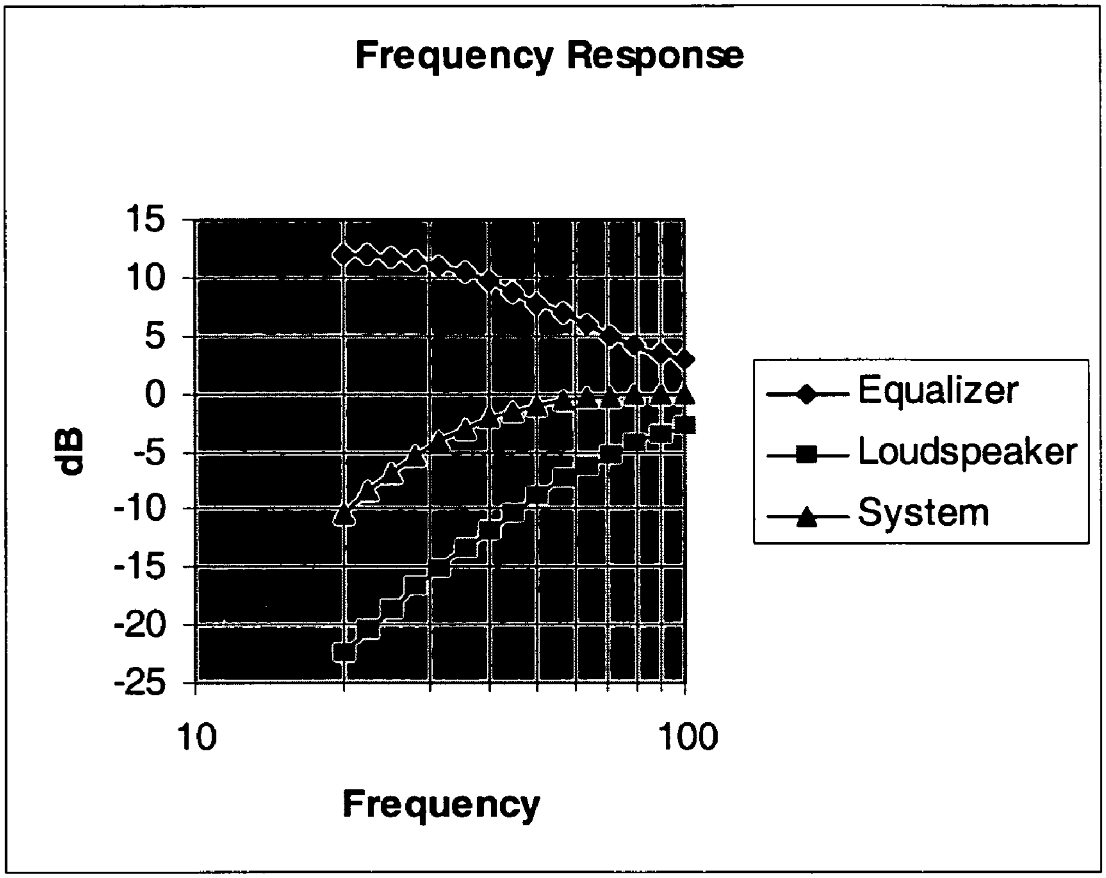
FIG. 5 is a frequency response graph showing the unequalized response of a Quasi Sealed System Loudspeaker (denoted by squares), the response of the EQSS Equalizer (denoted by diamonds), and the total response of the complete EQSS System (denoted by triangles)

FIG. 5 is a frequency response graph 50 showing the unequalized response 51 of a Quasi Sealed System 9 represented by squares, the frequency response 52 of the equalizer 3 represented by diamonds, and the total frequency response 53 of the complete EQSS arrangement represented by triangles. The response 51 of the QSS falls with decreasing frequency, being down 3 dB at approximately 90 Hz. The response 52 of the equalizer, on the other hand, rises with decreasing frequency, being up approximately 3 dB at 90 Hz. Similarly, at 35 Hz the response 51 of the QSS is down 14 dB while the response 52 of the equalizer is up 11 dB. Based on these observations it should be understood by one of ordinary skill in the art that the combination of the equalizer 3 and the QSS 9 provides a system response with extended low frequency response with a −3 dB frequency of approximately 35 Hz.

Figure 6:
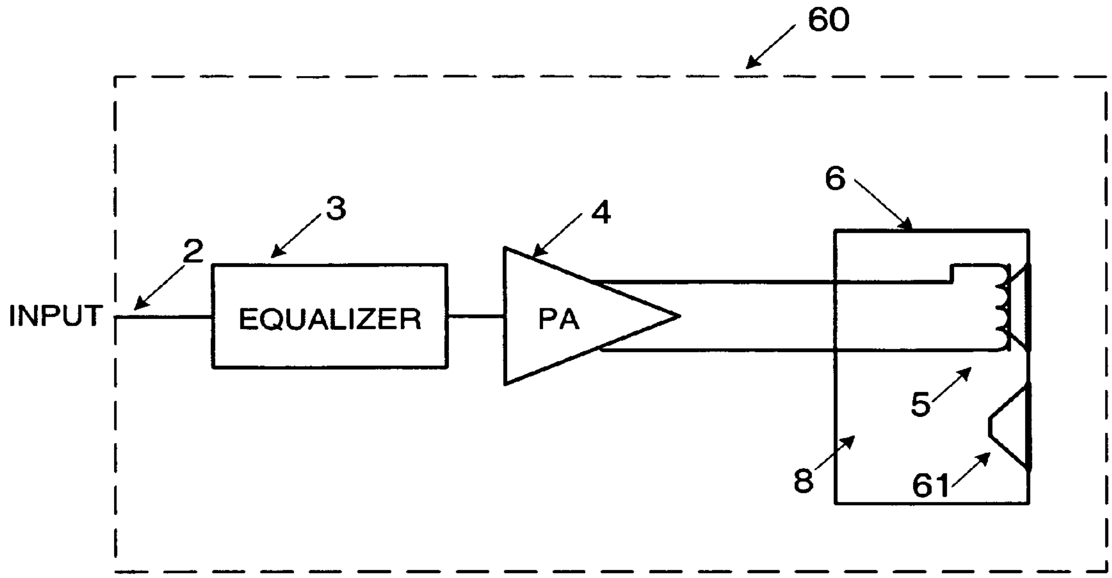
FIG. 6 is an illustration of a loudspeaker system 60 that implements the EQSS method and apparatus of the present invention by use of a passive radiator 61 in place of the port 7.

FIG. 6 is an illustration of a loudspeaker system 60 that implements the EQSS method and apparatus of the present invention by use of a passive radiator 61 in place of the port 7. This substitution is advantageous when the box tuning frequency fb and box volume Vb are such that the required length of the port is impractically long. The substitution of a passive radiator, sometimes known to those skilled in the art as a drone cone, with appropriately specified moving mass and compliance can facilitate the desired box tuning frequency in a smaller occupied space, while retaining all of the heretofore described aspects and operating principles of the present invention.

Figure 7:
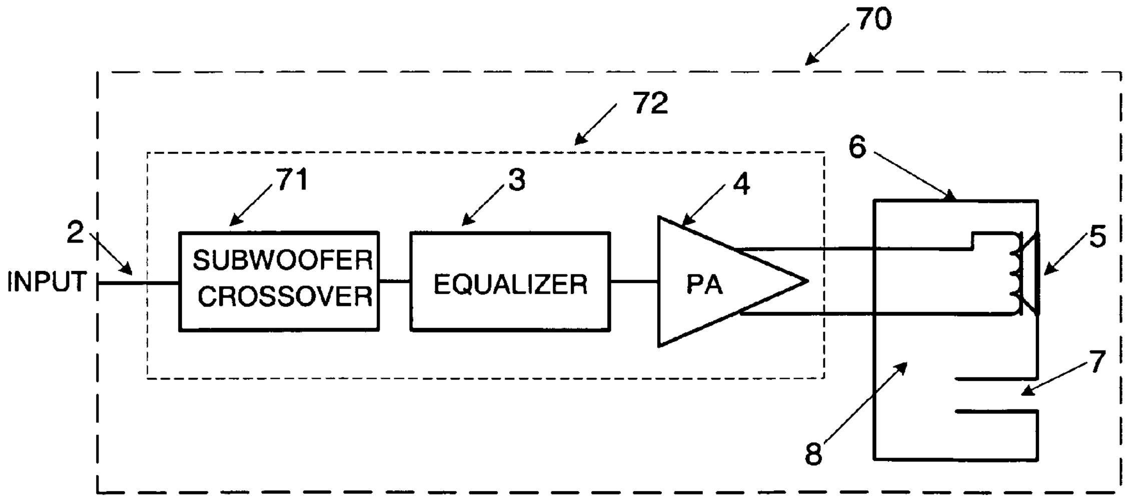
FIG. 7 is a block diagram illustrating the use of the EQSS method and apparatus of the present invention in connection with a subwoofer loudspeaker system 70.

FIG. 7 is a block diagram illustrating the use of the EQSS method and apparatus of the present invention in connection with a subwoofer loudspeaker system 70. Referring now to FIG. 7, as an alternative embodiment for use with subwoofers, this technique is similar to that described in FIG. 1, except that in this arrangement the input signal 2 passes through a subwoofer crossover 71 before entering the equalizer 3. In many applications, the subwoofer crossover 71, the equalizer 3 and the power amplifier 4 would be implemented together in a module 72, often referred to in the literature as a "plate amplifier". The EQSS method and apparatus of the present invention is especially advantageous for implementing subwoofers because subwoofers must be able to produce low frequencies faithfully at high levels, but often with a box of modest size and volume.

For purposes of illustration, and without limiting the scope of the invention, the subwoofer loudspeaker system 70 may be implemented with a 10-inch woofer 5 having the following Thiele-Small parameters: Vas=78 Liters; fs=34 Hz; Qts=0.32; Xmax=5.5 mm; effective diameter=21.5 cm. The subwoofer system 70 may further be implemented with a box of available volume Vb=28 Liters and a port that provides for a box tuning frequency fb=30 Hz. This combination of driver, box and port forms a Quasi Sealed System (QSS) whose frequency response is accurately modeled by a Virtual Sealed System (VSS) comprising a box with a volume of 25 Liters and a driver with the following Thiele-Small parameters: Vas=78 Liters; fs=30 Hz; and Qts=0.34. The model is accurate to within 1 dB down to frequencies as low as 17 Hz. The Quasi Sealed System is capable of producing 105 dB SPL or more down to frequencies as low as 30 Hz. The unequalized QSS has a frequency response that is down 3 dB at 60 Hz. With a proper biquadratic equalizer 3 providing a maximum boost of 12.3 dB, the frequency response of the complete EQSS arrangement thus formed is down 3 dB at 30 Hz with a system Q of 0.7. In preferred embodiments, the subwoofer crossover 71, the equalizer 3, and the power amplifier 4 would be implemented together inside the subwoofer enclosure on what is normally known as a subwoofer plate amplifier module 72.

It is notable that the woofer 5 employed in the subwoofer illustration above is a conventional woofer not specifically designed for a subwoofer application. For example, it has a value for Xmax of only 5.5 mm, whereas drivers designed specifically for the subwoofer application often have Xmax values in the range of 10-20 mm. Drivers designed to have large Xmax usually require much longer voice coils, causing less of the voice coil to reside in the magnetic gap at any given moment. This, in turn, results in reduced sensitivity and driver efficiency. A typical conventional subwoofer driver has an Xmax of 15 mm and an efficiency of 85.5 dB SPL @ 1 Watt/1 Meter. In contrast, the driver of the present EQSS subwoofer example of FIG. 7 has a sensitivity of 91.5 dB SPL @ 1 Watt/1 Meter, fully 6 db more efficient than the conventional subwoofer, corresponding to a factor of four in required driving power to reach a given SPL at upper bass frequencies. This means that the EQSS subwoofer can reach its ELSPL of 105 dB SPL with less than 30 Watts of electrical driving power from power amplifier 4 at upper bass frequencies.

The efficiency comparison at a low frequency of 40 Hz is also advantageous to the subwoofer operating in accordance with the present invention. The conventional subwoofer in a 28 L sealed enclosure has a response that is down 4.3 dB at 40 Hz, resulting in a 40 Hz sensitivity of 85.7−4.3=81.4 dB SPL @ 1 Watt/1 Meter. In contrast, the subwoofer designed in accordance with the present invention has an unequalized QSS response that is down 8 dB at 40 Hz, resulting in a 40 Hz sensitivity of 91.5−8=83.5 dB SPL @ 1 Watt/1 Meter, fully 2.1 dB better than the conventional subwoofer. The subwoofer designed in accordance with the present invention requires only 141 Watts of driving power from amplifier 4 to produce its ELSPL of 105 dB SPL at 40 Hz. This is a very modest amount of required amplifier power for a subwoofer housed in an enclosure that provides only one cubic foot of available volume. This demonstrates yet another advantage of the EQSS method and apparatus of the present invention, namely higher efficiency.

Figure 8:
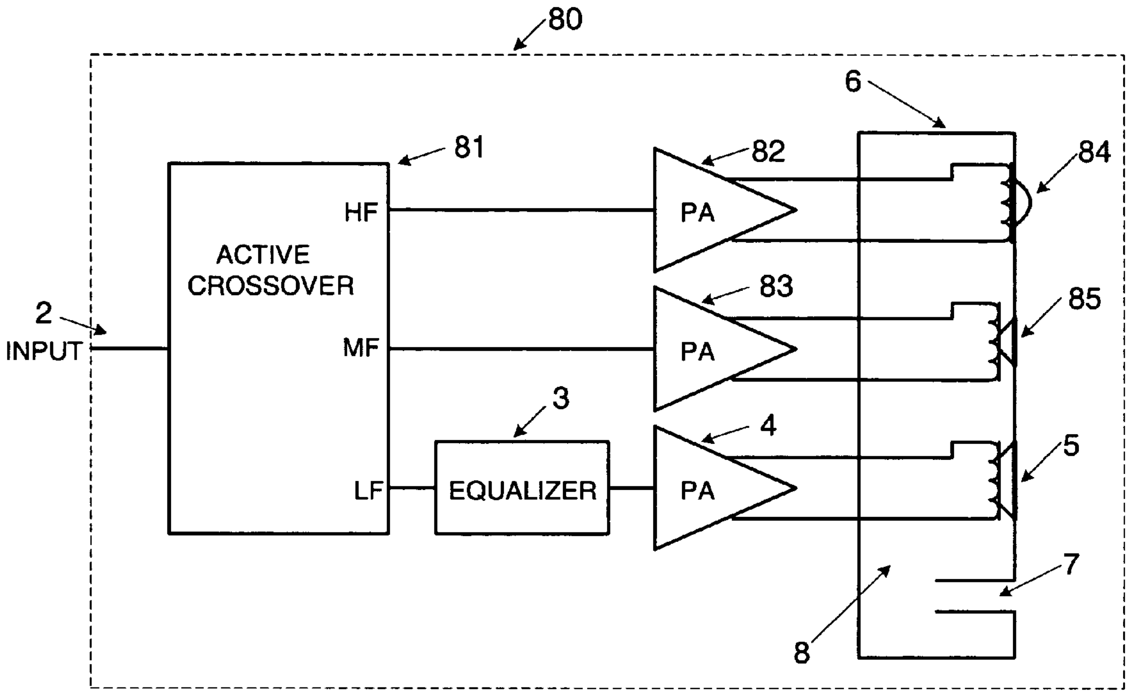
FIG. 8 is a block diagram illustrating the use of the EQSS method and apparatus of the present invention in connection with a full-range multi-way loudspeaker system 80 that employs an active crossover 81 and multiple power amplifiers 82, 83 and 4 driving a tweeter loudspeaker 84, a midrange loudspeaker 85 and a woofer loudspeaker 5.

FIG. 8 is a block diagram illustrating the use of the EQSS method and apparatus of the present invention in connection with a full-range, three-way loudspeaker system 80 that employs a three-way active crossover 81 and multiple power amplifiers 82, 83 and 84. FIG. 8 depicts one of many possible implementations of an active loudspeaker system. The high frequency (HF) output of crossover 81 is directed to power amplifier 82, and then to tweeter 85 as in a conventional active speaker system. Similarly, the midrange frequency (MF) output of crossover 81 is directed to power amplifier 83, and then to midrange loudspeaker 86, again as in a conventional active speaker system. The LF output of crossover 81 is directed to equalizer 3 and then to power amplifier 84, and finally to woofer 5. In preferred embodiments, equalizer 3 would be designed into the active crossover module. Such a system may be implemented with the electronic elements located separately and outside of the loudspeaker box, or, alternatively, with the electronic elements located inside the box. In the latter case, this would be referred to as a self-powered loudspeaker system.

Figure 9:
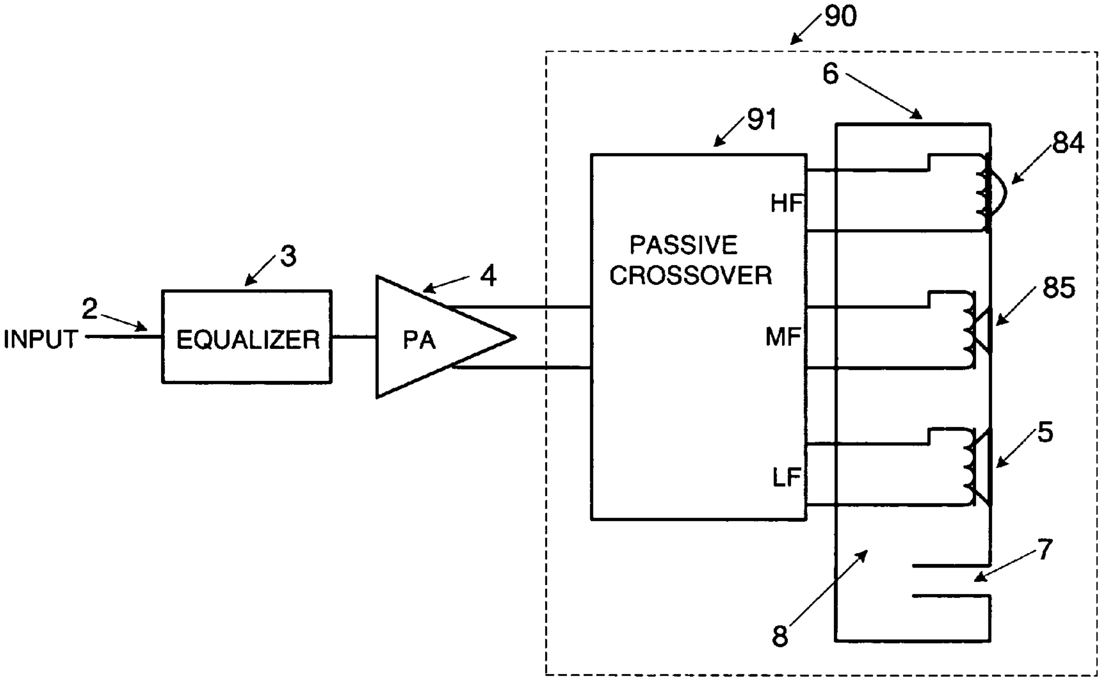
FIG. 9 is a block diagram illustrating the use of the EQSS method and apparatus of the present invention in connection with a full-range multi-way loudspeaker system 90 that employs a single power amplifier 4 and a passive crossover 91.

FIG. 9 is a block diagram illustrating the use of the EQSS method and apparatus of the present invention in connection with a largely conventional full-range loudspeaker system 90 that employs a passive crossover 92 and a single power amplifier 91. In a typical such arrangement, the passive crossover is located inside the loudspeaker enclosure 6, and is powered with conventional power amplifier 92 that would normally be a part of the rest of the entertainment or sound reinforcement system. In the example of FIG. 9, the equalizer 3, which is an integral and necessary part of the overall EQSS apparatus, is interposed between the line-level signal source (typically a preamplifier) and the power amplifier 92. The passive speaker system 90 is conventional in every way except that it includes a port and box that have been designed in conformance with the method of the present invention so as to yield a Quasi Sealed System that can be properly equalized by equalizer 3. FIG. 9 illustrates that the principles of the present invention are not limited to application in active loudspeaker systems, but instead can be applied to virtually any kind of loudspeaker system.

Figure 10:
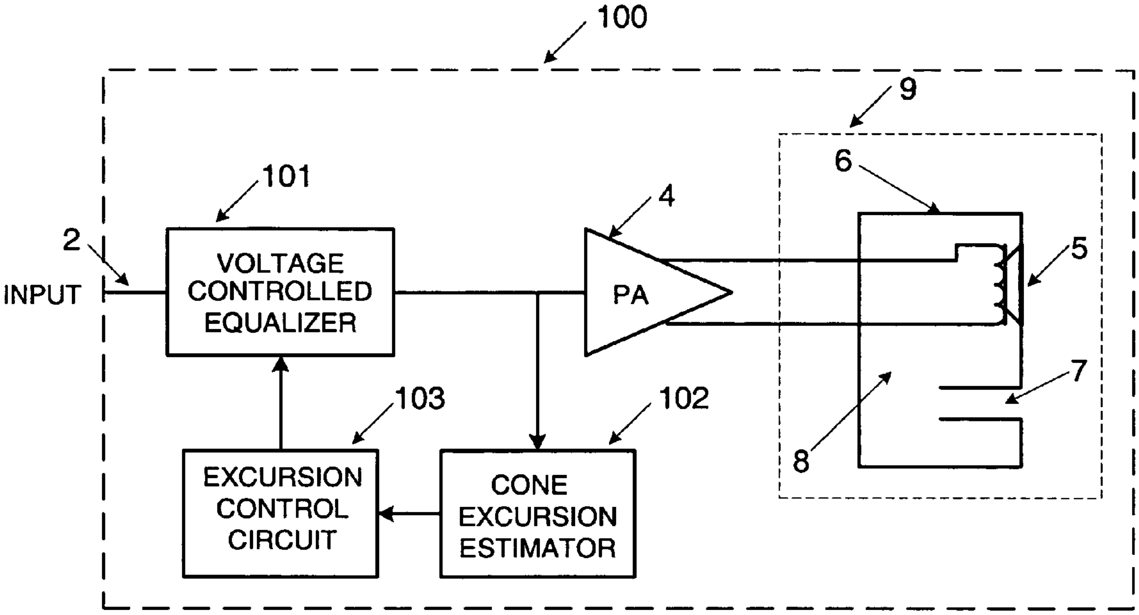
FIG. 10 is a block diagram illustrating the use of the EQSS method and apparatus of the present invention in connection with a loudspeaker system 100 that employs means for control of maximum cone excursion.

FIG. 10 is a block diagram illustrating an implementation of the EQSS method and apparatus of the present invention incorporating means for cone excursion control. Ported loudspeaker systems are more vulnerable to excessive cone excursion than sealed systems because at frequencies below the box tuning frequency there is effectively little or no air spring effect to control cone motion. This is exacerbated by the extra equalizer gain at low frequencies present in the EQSS system. Depending on expected program material, it may be desirable in some EQSS systems to employ an electronic control system that prevents over-excursion of the cone. This can be done by reducing the low-frequency gain boost of the EQSS equalizer only under those conditions where maximum cone excursion is being approached. In this way, most of the time under normal signal level conditions, the EQSS equalizer functions normally and the full frequency response and transient response benefits of EQSS are realized.

Referring now to FIG. 10, a cone excursion estimator circuit 102 produces a cone excursion signal that is fed to excursion control circuit 103. The amplitude of the cone excursion signal is proportional to the estimate of the cone excursion. The excursion control circuit 103 then processes the cone excursion signal into an appropriate equalizer control signal for application to voltage controlled equalizer 101. The equalizer 101 is designed to produce the same nominal equalization characteristic as equalizer 3, but has the further feature that its maximum gain at low frequencies is responsive to the equalizer control signal in such a way that the control signal can cause the maximum equalizer gain at low frequencies to become less than its nominal design value. Cone excursion can be estimated in many ways, but one preferred way is to pass the output of the EQSS equalizer through a filter function that models cone excursion as a function of speaker drive voltage. For a ported system, this filter function may include means to properly model the reduced cone excursion in the vicinity of the box tuning frequency. In operation of the means for cone excursion control, when the estimated cone excursion exceeds a predetermined value, the excursion control circuit 103 acts to reduce the maximum gain at low frequencies of the equalizer 101 so as to prevent excessive cone excursion.

Although preferred systems have been described hereinabove, other combinations of equipment can be used without deviating from the scope of the present invention. For example, the method and apparatus of the present invention can be applied to two-way self-powered studio monitors. It should also be clear to those skilled in the art that all of the steps of equalization pertinent to the present invention may be accomplished with digital signal processing techniques without deviating from the scope of the present invention.

Yet another application of the method and apparatus of the present invention is that of automobile subwoofer systems, wherein the advantages of extended low frequency response, high SPL capability at low frequencies, and high efficiency afforded by the present invention are all of great value. Larger automobile subwoofer systems with a long box dimension of 24 inches or more especially benefit from the EQSS method because of the ease with which they can accommodate a long port of adequate diameter, providing for low box tuning frequencies.

Still yet another application of the method and apparatus of the present invention is that of Home Theater subwoofer-satellite speaker systems. The principles of the present invention are especially advantageous to such an application because the small satellite speakers in such systems often have very poor low frequency response as a result of their very small size, thus requiring the subwoofer to operate at frequencies higher than normal for subwoofers (e.g., upwards of 200 Hz). An EQSS subwoofer built in accordance with the principles of the present invention has improved high frequency response in comparison with conventional subwoofers because the loudspeaker driver of an EQSS subwoofer does not have to be optimized for a subwoofer application, meaning that its high-frequency response need not be compromised by use of, for example, a heavy cone with large excursion capability.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What I claim is:

1. An improved low-frequency loudspeaker apparatus, comprising:

a loudspeaker driver that produces a cone excursion and is characterized by a maximum cone excursion;

a box for housing said loudspeaker driver;

a port in said box for tuning the box to a box tuning frequency whereby the combination of the loudspeaker driver and the box and said port have a first frequency response;

a power amplifier for energizing said loudspeaker driver;

an equalizer for altering said first frequency response to become a second frequency response and for providing a signal to said power amplifier;

a signal input means connected to said equalizer;

said first frequency response having a second-order high-pass frequency response characteristic whose amplitude at the box tuning frequency is substantially below the reference response level;

said equalizer being characterized by a maximum equalization gain;

said equalizer having a third frequency response, said third frequency response having a second-order biquadratic characteristic whereby said second frequency response is flat to substantially lower frequencies than those frequencies to which said first frequency response is flat.

2. The apparatus of claim 1 wherein said first frequency response is down at least 6 dB at said box tuning frequency.

3. The apparatus of claim 1 wherein said first frequency response is equal to within one dB of the frequency response of a second-order high pass function over frequencies extending downward to at least one-half octave below said box tuning frequency.

4. The apparatus of claim 1 wherein the equalizer provides a biquadratic filter function.

5. The apparatus of claim 1 wherein the equalizer is implemented by digital signal processing means so as to provide an amplitude frequency response that is an approximation of a biquadratic filter function.

6. The apparatus of claim 1 wherein the equalizer is located inside the box.

7. The apparatus of claim 1 wherein the equalizer is a separate function or piece of equipment located anywhere in the signal chain prior to the loudspeaker driver.

8. The apparatus of claim 1 wherein the power amplifier is a separate function or piece of equipment located external to said box.

9. The apparatus of claim 1 wherein said port is replaced with a passive radiator.

10. A loudspeaker apparatus having extended low-frequency response, comprising:

a signal input means;

a biquadratic frequency response equalizer connected to said signal input means;

a power amplifier connected to said equalizer;

a loudspeaker driver in an enclosure, said loudspeaker driver connected to said power amplifier;

a tuning device affixed to said enclosure for tuning said enclosure to a tuning frequency;

said enclosure, loudspeaker and tuning device together having a loudspeaker frequency response;

said loudspeaker frequency response having a second-order high-pass amplitude characteristic over a frequency band of interest;

said loudspeaker frequency response having an amplitude at the tuning frequency that is at least 6 dB lower than the amplitude of said loudspeaker frequency response at frequencies more than two octaves above the tuning frequency;

said loudspeaker apparatus having a system frequency response;

said frequency response equalizer having an equalizer frequency response; and said loudspeaker frequency response and said equalizer frequency responses together resulting in said system frequency response extending to lower frequencies by at least one octave than the said loudspeaker frequency response of the loudspeaker driver, enclosure, and port.

11. The loudspeaker apparatus of claim 10, wherein the frequency band of interest extends to frequencies that are at least one-half octave below the said tuning frequency.

12. The loudspeaker apparatus of claim 10, wherein the first frequency response of the said loudspeaker driver, enclosure, and tuning device is more accurately represented over the frequency band of interest by that of a sealed system than that of a ported system.

13. The loudspeaker apparatus of claim 10, wherein the frequency response equalizer comprises a biquadratic second-order filter function having the said equalizer frequency response.

14. The loudspeaker apparatus of claim 10 wherein the said equalizer frequency response of the biquadratic second-order filter function provides the desired second frequency response when used to equalize a second-order high-pass frequency response that approximates the first frequency response of the said loudspeaker driver, enclosure and tuning device.

15. A loudspeaker apparatus having extended low-frequency response, comprising:

a signal input means;

a biquadratic frequency response equalizer connected to said signal input means;

a power amplifier connected to said equalizer;

a loudspeaker driver in an enclosure, said loudspeaker driver connected to said power amplifier;

a tuning device affixed to said enclosure for tuning said enclosure to a tuning frequency;

said enclosure, loudspeaker and tuning device together having a first frequency response;

said first frequency response having a second-order high-pass amplitude characteristic over a frequency band of interest;

said first frequency response having an amplitude at the tuning frequency that is at least 6 dB lower than the amplitude of said first frequency response at frequencies well above the tuning frequency;

said frequency response equalizer having an equalizer frequency response; and said first frequency response and said equalizer frequency responses together having a second frequency response that is flat to substantially lower frequencies than said first frequency response.

* * * * *